United States Patent [19]

Gooen

[11] 4,063,277
[45] Dec. 13, 1977

[54] SEMICONDUCTOR THYRISTOR DEVICES HAVING BREAKOVER PROTECTION

[75] Inventor: Kenneth Herbert Gooen, Somerset, N.J.

[73] Assignee: RCA Corporation, New York, N.Y.

[21] Appl. No.: 690,902

[22] Filed: May 28, 1976

[51] Int. Cl.² ............................................. H01L 29/74
[52] U.S. Cl. ....................................... 357/38; 357/13; 357/39; 357/49; 357/86
[58] Field of Search ....................... 357/38, 39, 86, 13, 357/49

[56] References Cited
U.S. PATENT DOCUMENTS 3,792,320  2/1974  Hutson ................................... 357/39
3,855,611  12/1974  Neilson ................................... 357/38

Primary Examiner—Stanley D. Miller, Jr.
Assistant Examiner—Joseph E. Clawson, Jr.
Attorney, Agent, or Firm—H. Christoffersen; R. P. Williams; R. A. Hays

[57] ABSTRACT

Semiconductor thyristor devices with means, inherent in the structure thereof, for protecting the devices against damage due to breakover. The means requires, in a semiconductor controlled rectifier device, for example, that the active gate region have a comparatively smaller total charge than the adjacent base layer separating the active gate region from the anode layer.

13 Claims, 2 Drawing Figures

SEMICONDUCTOR THYRISTOR DEVICES HAVING BREAKOVER PROTECTION

The present invention generally relates to semiconductor thyristor devices and in particular to those devices having breakover protection.

Semiconductor thyristor devices are characterized generally as having four layers of alternating conductivities, i.e., NPNP or PNPN. In one such device, for example a silicon controlled rectifier (SCR), the layers are designated sequentially as the cathode layer, the gate layer, the base layer and the anode layer. An SCR is further characterized as having two operating states, a high impedance, or blocking state and a low impedance, or conducting state. Such an SCR is usually switched from the blocking state to the conducting state by the application of an appropriate signal to a gate electrode contacting the gate layer. However, an SCR is often switched in the absence of a gate signal when an excessively large voltage potential is applied across the cathode layer and the anode layer. This phenomenon is commonly known as breakover and the potential at which it occurs is known as the breakover and the potential at which it occurs is known as the voltage.

Breakover occurs when the gate layer/base layer PN junction, which is reverse biased during the conventional operation of the SCR, cannot sustain the excessive voltage potential thereacross and breaks down. The PN junction mentioned above usually breaks down in the avalanche mode. Avalanche mode breakdown is usually generated at a point defect in the material or the device or along an edge thereof. When breakdown occurs, the current which flows across the PN junction has a considerably high density at the point or edge defect which creates a very high temperature thereat. As known in the art, such a region of high temperature, or hot spot, can damage or destroy a device.

One conventional technique used to prevent the formation of such hot spots is to regulate both the comparative charge in the gate and base layers and the relative distances of the cathode and anode layers from the gate layer/base layer PN junction so the PN junction depletes into or punches through to the anode layer prior to avalanching. The principle of this solution is that the punchthrough mechanism is a distributed phenomenon and not a point phenomenon, so that when the device switches and current does flow across the junction it is less likely to create hot spots at the point of avalanching. However, when the device switches, i.e., turns on, the current flowing thereacross may not be distributed, or spread, throughout the gate layer and thus hot spots which damage or destroy the device are often created in this manner. These hot spots are due, primarily, to the comparatively higher charge level in the gate layer necessary to insure the punchthrough to the anode layer but which give charge carriers in that layer a comparatively lower mobility. The comparatively reduced mobility produces a high current density resulting in the hot spots.

From the above discussion it can be seen that a device which breaks over without avalanching and has a comparatively rapid current spreading is very desirable.

Figure 1:
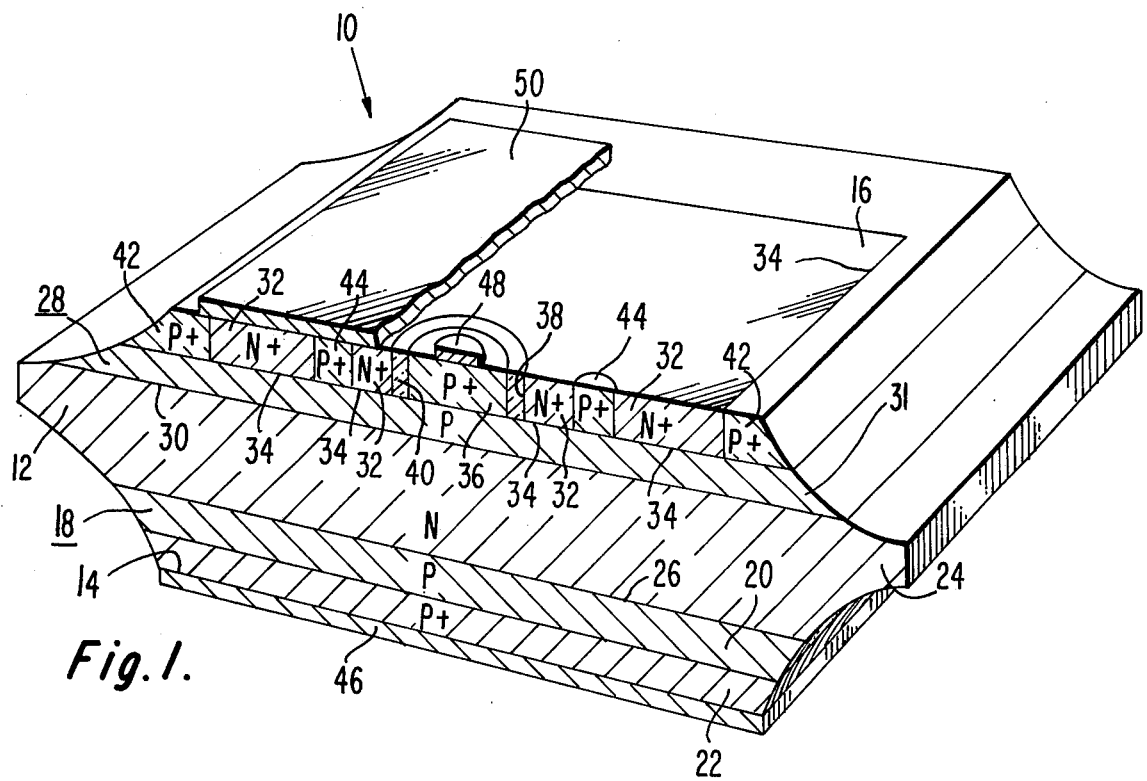
FIG. 1 is a perspective view, partly in section, of one embodiment of the present invention, not drawn to scale.

One embodiment of the present novel thyristor device, which is a silicon controlled rectifier (SCR), indicated generally at 10 in FIG. 1, comprises a body 12 of semiconductor material, for example silicon, having first and second major surfaces 14 and 16 respectively, which are substantially parallel and opposing each other. Preferably the body 12 is in the shape of a wafer having a thickness of between from about 150 micrometers to about 240 micrometers.

An anode layer 18 of semiconductor material having one type conductivity modifiers therein, in this example P type, is adjacent the first surface 14. Preferably, for reasons known in the art, the anode layer 18 is comprised of an upper portion 20 having a comparatively lower surface conductivity modifier concentration, for example between from about $5 \times 10^{15}$ atoms/cm$^3$ to about $5 \times 10^{16}$ atoms/cm$^3$, and a lower portion 22 having a comparatively higher surface conductivity modifier concentration, for example between from about $10^{18}$ atoms/cm$^3$ to about $10^{21}$ atoms/cm$^3$. Further, in the preferred device 10, the upper portion 20 of the anode layer 18 has a thickness of between from about 15 micrometers to about 65 micrometers while the lower portion 22 has a thickness of between from about 10 micrometers to about 20 micrometers.

A base layer 24 of semiconductor material having second type conductivity modifiers therein, N type in this embodiment, is within the body 12 adjacent the anode layer 18 and forms a first PN junction 26 at the interface therewith. The base layer 24 is preferably between from about 85 micrometers to about 180 micrometers in thickness and has an average conductivity modifier concentration of between from about $1 \times 10^{14}$ atoms/cm$^3$ to about $3 \times 10^{14}$ atoms/cm$^3$.

A gate layer 28 of semiconductor material having the one type conductivity modifiers therein is within the body 12 adjacent the base layer 24 and forms a second PN junction 30 at the interface therewith. The gate layer 28 is spaced apart from the anode layer 18 by the base layer 24. Preferably, the gate layer 28 is formed by known diffusion techniques and is characterized by a surface conductivity modifier concentration of between from about $5 \times 10^{15}$ atoms/cm$^3$ to about $5 \times 10^{16}$ atoms/cm$^3$ at the second surface 16 and a thickness of between from about 25 micrometers to about 85 micrometers.

A cathode layer 32 of semiconductor material having the second type conductivity modifiers therein is adjacent the second surface 16 and terminates in the gate layer 28, forming a third PN junction 34 at the interface therewith. The cathode layer 32 is spaced apart from the base layer 24 by a portion 31 of the gate layer 28. The portion 31 is hereinafter designated as the active gate region 31. Preferably, the cathode layer 32 has a thickness of between from about 10 micrometers to about 20 micrometers and a surface conductivity modifier concentration of between from about $10^{18}$ atoms/cm$^3$ to about $10^{21}$ atoms/cm$^3$. The resulting active gate region 31 therefore has a thickness on the order of between from about 15 micrometers to about 65 micrometers.

It is critical to the operation of the present device 10, for reasons explained below, that the total charge in the active gate region 31 be equal to, but preferably less than, the total charge in the base layer 24. The total charge is, for all intents and purposes, substantially completely dependent upon the volume of semiconductor material and the number of conductivity modifiers therein. For a given layer or region the volume, which is equal to the area times the thickness, the total charge is primarily dependent, among similar devices, upon the thickness of the layer of interest. Herein the total charge of a given layer or region is considered to be substantially equal to the total number of conductivity modifiers in that layer or region. The total number of conductivity modifiers, in this instance, is taken to mean the total number of uncompensated conductivity modifiers in a given region.

A first region 36 of semiconductor material having the one type conductivity modifiers therein preferably extends from the second surface 16 through the cathode layer 32 to the active gate region 31. Preferably the first region 36 is substantially centrally located in the cathode layer 32 and has a surface conductivity modifier concentration of between from about $10^{18}$ atoms/cm$^3$ to about $10^{21}$ atoms/cm$^3$.

A moat 38, which may contain an isolating material 40, for example silicon dioxide, laterally surrounds the first region 36 and substantially isolates the first region 36 from the cathode layer 32.

A second region 42 of semiconductor material having the one type conductivity modifiers therein substantially laterally surrounds the cathode layer 32 extending from the second surface 16 to the active gate region 31. Preferably the second region 42 has a surface conductivity modifier concentration on the same order as that of the first region 36.

A plurality of third regions 44 of semiconductor material having the one type conductivity modifiers therein can be dispersed, for reasons explained below, in the cathode layer 32 between the first region 36 and the second region 42. The third regions 44 substantially extend from the second surface 16 to the active gate region 31. Preferably the surface conductivity modifier concentration is on the same order as that of the first region 36.

It should be noted that the number of conductivity modifiers in the first, second and third region 36, 42 and 44 respectively, for present intents and purposes are not deemed to contribute to the total of the active gate region 31.

First electrode means 46 electrically contact the lower portion 22 of the anode layer 18. Second electrode means 48 electrically contact the first region 36 which, because of its comparatively high conductivity modifier concentration, provides an electrical path from the second electrode means 48 to the active gate region 31. Third electrode means 50 electrically contact the cathode layer 32. In this embodiment, the third electrode means 50 also contacts the second region 42 and substantially completely overlies the plurality of third regions 44.

While the device 10 can be fabricated using known techniques it is preferable that the number and distribution of the conductivity modifiers of at least the active gate region 31 be as accurately reproducible as possible. In order to accomplish this reproducibility, known diffusion techniques are preferably used to form the gate layer 28. One advantageous feature of the device 10 is that the lower portion 22 of the anode layer 18, the first and second regions, 36 and 42 respectively, and the plurality of third regopms 44 can be formed simultaneously since the conductivity modifier concentrations thereof are on the same order of magnitude. The simultaneous fabrication may be accomplished using, for example, known masking, photolithographic and diffusion techniques.

Figure 2:
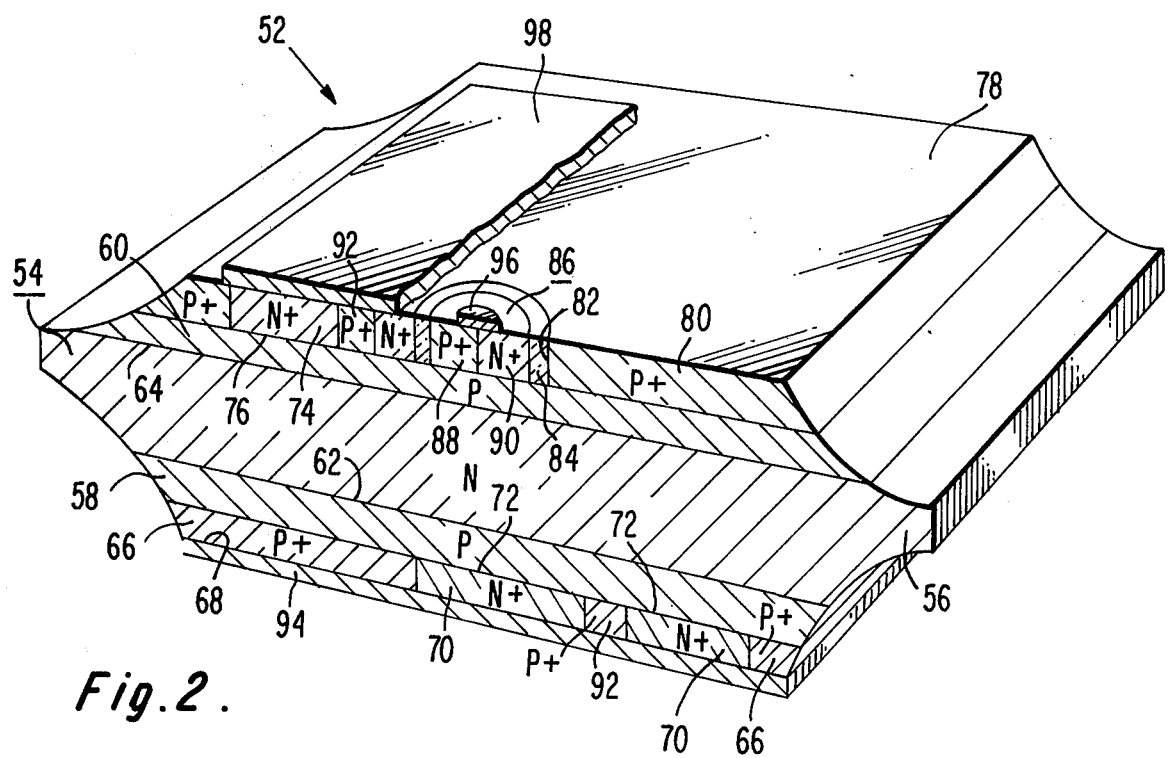
FIG. 2 is a partial perspective view of a second embodiment of the present invention, not drawn to scale.

A second embodiment of the present device, in this case a Triac, indicated generally at 52 in FIG. 2, comprises a body 54 of semiconductor material having features similar to the body 12 of the device 10. A Triac may be characterized as being two SCR's connected in reverse parallel relation i.e., the anode of one connected to the cathode of the other and the cathode of one connected to the anode of the other. It should be noted that breakover, the phenomenon which the present novel structure controls, may occur with the resulting current flowing in either direction across the device 52. The direction of current flow after breakover is dependent upon the polarity of the biasing of the device 52 at the instant that breakover occurs.

The device 52 has a base layer 56 within the body. In this example, the base region 56 has the second type conductivity modifiers therein. First and second active gate regions, 58 and 60 respectively, having the one type conductivity modifiers therein are adjacent the base layer 56 and spaced thereby. The first active gate region 58 structurally, but not functionally, corresponds to the upper portion 20 of the anode layer 18 of the device 10. First and second PN junctions, 62 and 64 respectively, are formed at the interfaces between the first and second active gate regions, 58 and 60 respectively, and the base layer 56.

An anode layer 66 having the one type conductivity modifiers therein is adjacent the first active gate region 58 and a first major surface 68 of the body 54. A first cathode region 70 having the second type conductivity modifiers therein is within the anode layer 66. The first cathode region 70 extends from the first surface 68 to the first active gate region 58 and forms a third PN junction 72 at the interface therewith.

A cathode layer 74 having the second type conductivity modifiers therein is adjacent the second active gate region 60, forming a fourth PN junction 76 at the interface therewith, and terminates at a second major surface 78 of the body 54. The first surface 68 and the second surface 78 are oppositely disposed and preferably substantially parallel with each other. A first anode region 80 having the one type conductivity modifiers therein is within the cathode layer 74. The first anode region 80 extends from the second surface 78 to the second active gate region 60. Preferably the first anode region 80 is oppositely aligned with the first cathode region 70.

Within the cathode layer 74, preferably substantially central thereto, there is a moat 82, which may be filled with insulating material 84, which substantially surrounds a first region 86 and which is similar to the first region 36 of the device 10. The first region 86 is comprised of two laterally adjacent portions, a first portion 88 and a second portion 90. The first region 86 extends from the second surface 78 to the second active gate region 60. The first portion 88 and the second portion 90 have different type conductivity modifiers therein.

A plurality of second regions 92 having the second type conductivity modifiers therein similar to the plurality of third regions 44 of the device 10 is disposed, for like reasons, as explained below, in the cathode layer 74 and the first cathode region 70.

First electrode means 94 electrically contacts the anode layer 66 and the first cathode region 70 and overlies those members of the plurality of second regions 92 therein. Second electrode means 96 electrically contacts the first and second portions, 88 and 90 respectively, of the first region 86. Depending on the polarity of a signal applied to the second electrode means 96, the first portion 88 or the second portion 90 provides a conductive path therefrom to the second active gate region 60. Third electrode means 98 electrically contacts the cathode layer 74 and the first anode region 80 overlies those members of the plurality of second regions 92 in the cathode layer 74.

The thickness and conductivity modifier concentration of the various layers and regions of the device 52 are similar to those of the device 10. In order that the device 52 operate in the desired manner, to be described below, it is necessary not only for the total charge in the second active gate region 60 be at least equal to, but preferably less than, the total charge of the base layer 56, as in the corresponding structure of the device 10, but also that the total charge of the first active gate region 58 be at least equal to, but preferably less than, the total charge of the base layer 56. This structure is more easily obtained when the first and second active gate regions 58 and 60 respectively, are formed simultaneously by known diffusion processes for example.

The operation of the SCR device 10 during the breakover mode is described below. The normal operating conditions necessary for this discussion are that a comparatively negative voltage potential be applied to the third electrode 50 and a comparatively positive voltage potential be applied to the first electrode 46. The voltage potential applied to the second electrode 48 is immaterial so long as the device 10 is initially in the high impedance, or blocking state. Under these conditions the first PN junction 26 is forward biased and the second PN junction 30 is reversed biased.

As known in the art, when a PN junction is reverse biased, a depletion region is formed which extends into the layers adjacent that PN junction. A depletion region occurs because, due to the reverse bias voltage, charge carriers are repelled away from the PN junction. Hence, as the reverse bias voltage increases the depletion region repels more charge carriers and thus expands further away from the PN junction. The distance that a depletion region extends, for a given voltage, into the material on either side of the PN junction is primarily dependent upon the total charge concentration therein. That is, a depletion region extends, for a given voltage, further into a layer having a comparatively lower conductivity modifier concentration than into a layer having a comparatively higher conductivity modifier concentration because of the comparatively lesser number of charges available to be repelled near the PN junction. Stated another way, a given voltage repels a particular number of charges away from the PN junction, and if that number of charges is not available in the material near the PN junction then charges further away from the PN junction are repelled. Since the expansion of the depletion region is dependent upon the reverse bias voltage across the PN junction the shape of the expanding depletion region substantially corresponds to the voltage variation therealong. In the present devices 10 and 52, the PN junctions of interest are substantially parallel to the major surfaces of the devices and the voltage variation thereacross is substantially, for the purpose of the ensuing discussion, zero. Characteristically, a depletion region is similar to a parallel plate capacitor. That is, electric field is sustained thereacross and a time varying voltage thereacross generates a displacement current in the material outside of the depletion region. A depletion region continues to expand under increasing reverse biased voltage until, for example, a layer of comparatively higher conductivity modifier concentration is reached, whereupon the depletion region can no longer sustain the applied voltage and current flows thereacross.

In the SCR device 10, under the above-described bias conditions, the second PN junction 30, being reverse biased, depletes into both the active gate region 31 and the base layer 24. However, because the active gate region 31 has a comparatively lower total charge than, i.e., comparatively lower total number of conductivity modifiers, the base layer 24 the depletion region reaches the cathode layer 32 prior to reaching the anode 18. It is obvious that in order to insure that the depletion region reaches a cathode layer 32 prior to the second PN junction 30 avalanching, the total charge i.e., that contributed by the number of uncompensated conductivity modifiers in the active gate region 31 must be less than the number necessary to break down the second PN junction 30 in the avalanche mode. Upon reaching the cathode layer 32 the depletion region breaks down, due to the comparatively greater conductivity modifier concentration of the cathode layer 32, and breakover occurs. If the total charge of the active gate region 31 is substantially equal to the total charge in the base layer 24 the depletion region will reach the cathode layer 32 and the lower portion 22 of the anode layer 18 substantially simultaneously and break down substantially simultaneously at both the cathode layer 32 and the anode layer 18. At breakover, the device 10 switches from the blocking state to the conducting state and current flows therethrough. The turn-on of the present devices, 10 and 52 takes place substantially uniformly across the third PN junction 34. This occurs because of the substantially uniform expansion of the depletion region and due to the substantially uniform thickness of the active gate region 31, as discussed above. Hence the spread of current throughout the active gate region 31 is more rapid, with respect to the other modes of breakover, and thus less susceptible to hot spots. Further, since the active gate region 31 has a comparatively lower conductivity modifier concentration than conventional devices, the mobility of charge carriers is comparatively greater therein and hence there is less chance of hot spots forming due to poor mobility.

A structure as described herein is ordinarily undesirable in conventional devices. This is primarily because of the fact that having the total charge comparatively lower in the active gate region 31 than in the base layer 24 usually results in a rather low $dv/dt$ rating for the device 10, for example. The $dv/dt$ rating of a device is a measure of the amount of voltage change per unit time that a device can withstand before switching to a conducting state. A high $dv/dt$ rating is desirable so that a device is not switched on due to comparatively low voltage transients. The mechanism is described as follows. When the voltage potential across the cathode layer 32 and the anode layer 18 changes, a displacement current flows in the active gate region 31, as well as elsewhere. If, due to the displacement current flowing through the resistive material of the active gate region 31, a voltage differential of sufficient size, for example of about 0.7 volts, appears across the third PN junction 34, current flow thereacross and the device will turn-on. The current path, for illustration purposes, can be pictured as being from any point of generation along the depletion region outward to the second region 42 and out of the device via the third electrode 50. A comparatively small $dv/dt$ can create sufficient current which, by flowing through a comparatively higher resistivity material, due to the comparatively lower conductivity modifier concentration, causes the device, 10 or 52, to turn-on. This is one reason conventional devices have comparatively higher conductivity modifier concentrations in the gate layers thereof. In order to maintain the advantages of having the second PN junction 30 punch through to the cathode layer 32 prior to the anode layer 18 and to achieve a comparable, with respect to conventional devices, $dv/dt$ rating, the plurality of third regions 44 are provided. The plurality of third regions 44, or shorting dots, are dispersed in the cathode layer 32 so that the displacement current path through the active gate region 31 is shortened. That is, current flowing through the active gate region 31 now flows from its point of generation along the depletion region to the nearest shorting dot and out of the device 10 or 52 via the third electrode 50. Hence, the $dv/dt$ rating of the device 10 is increased.

The operation of the Triac device 52, as shown in FIG. 2, is essentially the same as that of the SCR device 10. If the Triac device 52 is viewed as comprising two SCRs connected in reverse parallel relation, for example one SCR comprising the vertical structure of the cathode layer 74, the second active gate region 60, the base layer 56 and the layer 66 and the other SCR comprising the vertical structure of the cathode region 70, the first active gate region 58, the base layer 56 and the anode region 80, then the description of operation thereof is the same as that described above. That is, the above description of the SCR device 10 applies to whichever SCR of the Triac is biased in the proper manner.

The present novel structure yields a thyristor device which has excellent protection against damage due to breakover. These devices, 10 and 52, also have $dv/dt$ ratings which are comparable with conventional devices.

What is claimed is:

1. A semiconductor device comprising:
   an anode layer of semiconductor material adjacent a first surface of a body of semiconductor material, said anode layer containing one type conductivity modifiers;
   a base layer of semiconductor material within said body adjacent said anode layer, said base layer containing a number of uncompensated second type conductivity modifiers and forming a first PN junction with said anode layer at the interface therewith;
   an active gate region of semiconductor material within said body adjacent said base layer and spaced apart from said anode layer thereby, said active gate region containing a number of uncompensated said one type conductivity modifiers and forming a second PN junction with said base layer at the interface therewith, said number of uncompensated conductivity modifiers in said active gate region being less than that required to break down said second PN junction in an avalanche mode, said number of uncompensated conductivity modifiers in said active gate region being comparatively less than said number of uncompensated conductivity modifiers in said base layer; and
   a cathode layer of semiconductor material adjacent a second major surface, and also adjacent said active gate region, said cathode layer being spaced apart from said base layer thereby, said second surface opposing said first surface, said cathode layer containing said second type conductivity modifiers and forming a third PN junction with said active gate region at the interface therewith.

2. A semiconductor device as claimed in claim 1 further comprising:
   a first region of semiconductor material having said one type conductivity modifiers extending from said second surface through said cathode layer to said active gate region.

3. A semiconductor device as claimed in claim 2 wherein:
   said first region is substantially centrally located in said cathode layer.

4. A semiconductor device as claimed in claim 2 further comprising:
   a moat laterally surrounding said first region.

5. A semiconductor device as claimed in claim 4 wherein:
   said moat contains isolating material therein.

6. A semiconductor device as claimed in claim 1 further comprising:
   a second region having said one type conductivity modifiers substantially laterally surrounding said cathode layer and extending from said second surface to said active gate region.

7. A semiconductor device as claimed in claim 1 further comprising:
   a plurality of third regions having said one type conductivity modifiers, said third regions being dispersed in said cathode layer extending from said second surface to said active gate region; and
   electrode means in electrical contact with said cathode layer and substantially completely overlying said plurality of third regions.

8. A semiconductor device as claimed in claim 1 wherein:
   said anode layer comprises an upper portion and a lower portion, said upper portion having a comparatively lower conductivity modifier concentration than said lower portion.

9. A semiconductor device as claimed in claim 8 wherein:
   said upper portion has a total number of conductivity modifiers which is comparatively lower in number than the total number of said conductivity modifiers in said base layer.

10. A semiconductor device as claimed in claim 9 further comprising:
    a cathode region having said second type conductivity modifiers in said lower portion of said anode layer; and
    an anode region having said one type conductivity modifiers in said cathode layer.

11. A semiconductor device as claimed in claim 10 wherein:
    said cathode region and said anode region oppose each other.

12. A semiconductor as claimed in claim 10 further comprising:
    a first region extending from said second surface through said cathode layer to said active gate region, said first region comprising two laterally adjacent portions, said portions containing different type conductivity modifiers.

13. A semiconductor device as claimed in claim 10 further comprising:
    a plurality of third regions having said one type conductivity modifiers, said third regions being dispersed in said cathode layer and said cathode region.

* * * * *

UNITED STATES PATENT OFFICE
CERTIFICATE OF CORRECTION

Patent No. 4,063,277  Dated Dec. 13, 1977

Inventor(s) Kenneth Herbert Gooen

It is certified that error appears in the above-identified patent and that said Letters Patent are hereby corrected as shown below:

| | |
|---|---|
| Col. 1, line 25: | delete "and the potential at which it occurs is known as the" |
| Col. 3, line 66: | "regopns" should be --regions-- |
| Col. 4, line 23: | insert "apart" after --spaced-- |
| Col. 7, line 28: | insert "anode" before --layer 66-- |
| Col. 8, line 48: | "porition" should be --portion-- |
| Col. 8, line 56: | insert "device" after --semiconductor-- |

Signed and Sealed this

Twenty-eighth Day of March 1978

[SEAL]

Attest:

RUTH C. MASON
*Attesting Officer*

LUTRELLE F. PARKER
*Acting Commissioner of Patents and Trademarks*